(12) United States Patent  
Takahashi et al.

(10) Patent No.: US 9,142,559 B2
(45) Date of Patent: Sep. 22, 2015

(54) SEMICONDUCTOR INTEGRATED CIRCUIT DEVICE (71) Applicant: Renesas Electronics Corporation, Kawasaki-shi (JP)

(72) Inventors: Hiroyuki Takahashi, Kawasaki (JP); Seiya Yamano, Yokohama (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/524,966

(22) Filed: Oct. 27, 2014

(65) Prior Publication Data

US 2015/0041922 A1 Feb. 12, 2015

Related U.S. Application Data (63) Continuation of application No. 13/438,731, filed on Apr. 3, 2012, now Pat. No. 8,908,455.

(30) Foreign Application Priority Data

Apr. 12, 2011 (JP) ................................ 2011-087972

(51) Int. Cl.
G11C 7/02 (2006.01)
H01L 27/108 (2006.01)
G11C 7/18 (2006.01)
(Continued)

(52) U.S. Cl.
CPC ............ *H01L 27/10897* (2013.01); *G11C 7/12* (2013.01); *G11C 7/18* (2013.01); *H01L 21/823437* (2013.01); *H01L 27/0207* (2013.01);
(Continued)

(58) Field of Classification Search
USPC .................. 365/202, 214, 203; 257/393, 200
See application file for complete search history.

(56) References Cited

U.S. PATENT DOCUMENTS 6,094,390 A 7/2000 Inaba et al.
6,795,358 B2 9/2004 Tanaka et al.
(Continued)

FOREIGN PATENT DOCUMENTS

CN 1877835 A 12/2006
JP 2004-087074 A 3/2004
(Continued)

OTHER PUBLICATIONS

U.S. Office Action dated Mar. 20, 2014 in U.S. Appl. No. 13/438,731.
(Continued)

*Primary Examiner* — Vu Le
(74) *Attorney, Agent, or Firm* — McGinn IP Law Group, PLLC.

(57) ABSTRACT

A semiconductor integrated circuit device includes a pair of complementary signal lines, a first transistor including a gate, a source, and a drain, one of the source and the drain of the first transistor being coupled to one of the pair of the complementary signal lines, and a second transistor including a gate, a source, and a drain, the gate of the second transistor being coupled to the gate of the first transistor, one of a source and a drain of the second transistor coupled to an other of the source and the drain of the first transistor, and an other of the source and the drain of the second transistor being coupled to the other of the pair of the complementary signal lines. A direction of a gate width of the first transistor is different from a direction of a gate width of the second transistor.

9 Claims, 5 Drawing Sheets (51) Int. Cl.
*G11C 7/12* (2006.01)
*H01L 27/02* (2006.01)
*H01L 21/8234* (2006.01)
*H01L 27/088* (2006.01)
*H01L 29/10* (2006.01)

(52) U.S. Cl.
CPC .......... *H01L 27/088* (2013.01); *H01L 29/1095* (2013.01)

(56) References Cited

U.S. PATENT DOCUMENTS

| | | | |
|---|---|---|---|
| 6,822,916 | B2 | 11/2004 | Frey et al. |
| 7,193,912 | B2 | 3/2007 | Obara et al. |
| 7,541,655 | B2 | 6/2009 | Iwata et al. |
| 7,583,550 | B2 | 9/2009 | Ohgami |
| 2003/0107913 | A1* | 6/2003 | Nii ................. 365/154 |
| 2004/0124440 | A1* | 7/2004 | Takemura et al. ............. 257/200 |
| 2006/0273407 | A1* | 12/2006 | Iwata et al. .................. 257/393 |

FOREIGN PATENT DOCUMENTS

| | | |
|---|---|---|
| JP | 2005-340367 A | 12/2005 |
| JP | 3787500 B2 | 6/2006 |
| JP | 2008-171928 A | 7/2008 |

OTHER PUBLICATIONS

U.S. Notice of Allowance dated Jul. 2, 2014 in U.S. Appl. No. 13/438,731.
Japanese Office Action for Application No. 2011-087972 dated Sep. 30, 2014 with English Translation.
Chinese Office Action dated Apr. 3, 2015 with English Translation.

* cited by examiner

SEMICONDUCTOR INTEGRATED CIRCUIT DEVICE

The present application is a Continuation Application of U.S. patent application Ser. No. 13/438,731, filed on Apr. 3, 2012, which is based on and claims priority from Japanese patent application No. 2011-087972, filed on Apr. 12, 2011, the entire contents of which are incorporated herein by reference.

BACKGROUND

The present invention concerns a semiconductor integrated circuit device and it particularly relates to a semiconductor integrated circuit device having a plurality of transistors formed over one identical diffusion layer.

In the semiconductor integrated circuit device, reduction in the circuit area directly leads to reduction in the manufacturing cost. Particularly, in a case of semiconductor memory devices, etc., when the area of a circuit portion that is used repetitively in an identical layout pattern can be reduced even at the slightest, a significant effect of decreasing the cost can be obtained.

Figure 1:
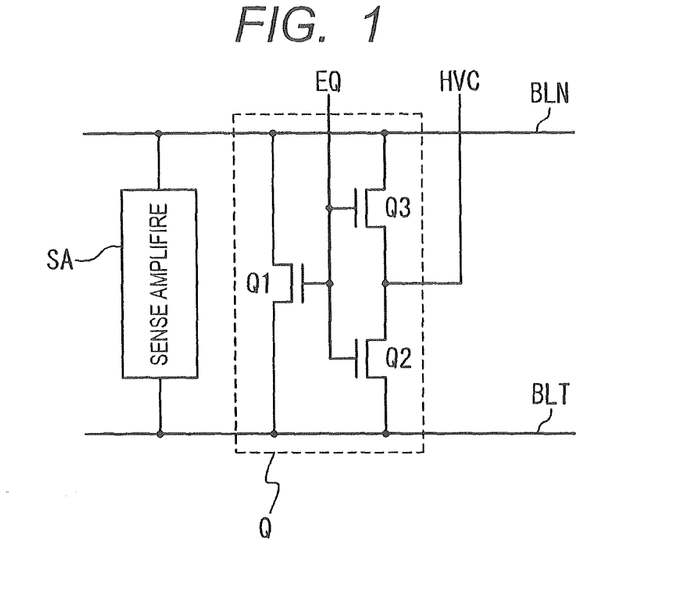
FIG. 1 is a circuit diagram showing the configuration of a sense amplifier circuit in a general dynamic semiconductor memory device.

A sense amplifier circuit is used repetitively as a circuit portion in a dynamic semiconductor memory device. In the dynamic semiconductor memory device, a plurality of sense amplifier circuits are coupled to a memory cell array in which memory cells are arranged in a matrix. FIG. 1 is a circuit diagram showing the configuration of one sense amplifier circuit in a general dynamic semiconductor memory device.

Referring to the constitutional elements of the sense amplifier circuit in FIG. 1, the sense amplifier circuit includes a first bit line BLT, a second bit line BLN, a sense amplifier SA, a precharge/balance device Q, an equalize signal input portion EQ, and a half power source voltage input portion HVC. The precharge/balance device Q includes a first transistor Q1 as a balance device, a second transistor Q2 as a first precharge device, and a third transistor Q3 as a second precharge device. As the most general sense amplifier SA, a simple flip-flop circuit is used.

The coupling relation for the constitutional elements in the sense amplifier circuit in FIG. 1 is to be described. One end of the sense amplifier SA is coupled to a first bit line BLT. The other end of the sense amplifier SA is coupled the second bit line BLN. One of the source and the drain of the first transistor Q1 is coupled to the first bit line BLT. The other of the source and the drain of the first transistor Q1 is coupled to the second bit line BLN. Gates of the respective first to third transistors Q1 to Q3 are coupled in common to the equalize signal input portion EQ. One of the source and the drain of the second transistor Q2 is coupled to the first bit line BLT. One of the source and the drain of the third transistor Q3 is coupled to the second bit line BLN. The other of the source and the drain of the respective second and third transistors Q2 and Q3 are coupled to the half power source voltage input portion HVC.

The operation of the sense amplifier circuit shown in FIG. 1 is to be described briefly. At first, the potential difference between the first and second bit lines BLT and BLN is decided depending on the state of a memory cell coupled to one of the bit lines thereof and selected by a word line.

The half power source voltage input portion HVC supplies a half power source voltage as one-half of a power source voltage VCC to the source-drain coupling portion of the second and third transistors Q2 and Q3. As a result, the second and third transistors Q2 and Q3 precharge the half power source voltage to the first and the second bit lines BLT and BLN. Since the second and third transistors Q2 and Q3 operate as two precharge devices, they are generally designed with an identical size of the gate width and in a symmetrical layout.

Finally, the sense amplifier SA amplifies the voltages of the first and second bit lines BLT and BLN to complementary potentials in accordance with the difference between the potentials and the half power source voltage respectively.

Then, the gates of the first, second, and third transistors Q1, Q2, and Q3 are provided an equalize signal from the equalize signal input portion, respectively. As a result, the source and the drain are conducted in each of the first, second, and third transistors Q1, Q2, and Q3, and the voltages of the first and second bit lines BLT and BLN become identical. While the same effect can be obtained only by the second and third transistors Q2 and Q3, if the first transistor is added, a potential is supplied to the first and second bit lines BLT and BLN and the potentials of the BLT and BLN can be equalized at a higher speed by the first transistor when it is intended to equalize the voltages between them. As described above, since the first transistor Q1 operates as a balance device, the gate width is generally designed to be longer than the gate width of the second or third transistor Q2 or Q3 so that a larger current flows at once.

Figure 2A:
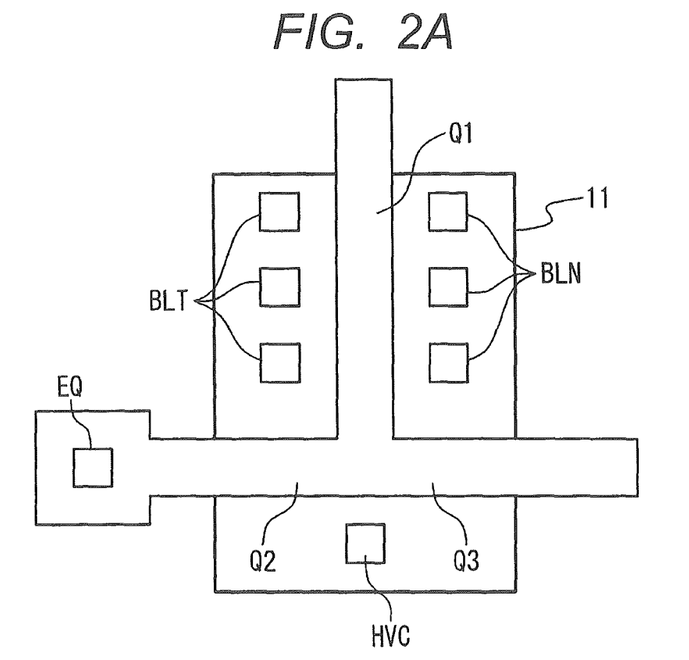
FIG. 2A is a plan view showing a layout of a semiconductor integrated circuit portion that schematically illustrates the precharge/balance device in FIG. 1.
Figure 2B:
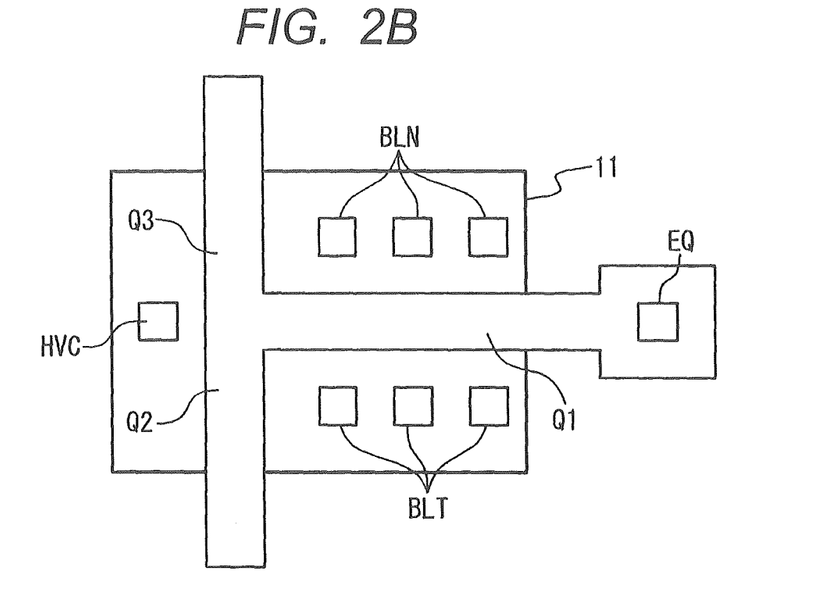
FIG. 2B is a plan view showing another layout of a semiconductor integrated circuit portion that schematically illustrates the precharge/balance device in FIG. 1.

FIG. 2A is a plan view showing a layout of a semiconductor integrated circuit portion that schematically illustrates the precharge/balance device Q shown in FIG. 1. FIG. 2B is a plan view showing another layout of a semiconductor integrated circuit portion that schematically illustrates the precharge/balance device Q in FIG. 1.

Each of the semiconductor integrated circuit portions in FIG. 2A and FIG. 2B includes first to third transistors Q1 to Q3 in the same manner as the precharge/balance device Q in FIG. 1. In the layout of FIG. 2A and FIG. 2B, the first bit line BLT, the second bit line BLN, the equalize signal input portion EQ, and the half power source voltage input portion HVC are drawn as contacts that can be coupled to respective wirings.

In the layout of FIG. 2A, the first, second, and third transistors Q1, Q2, and Q3 are formed over one identical diffusion layer 11. The first, second, and third transistors Q1, Q2, and Q3 have a gate in common, and the gate is coupled to the contact for the equalize signal input portion EQ. The first and second transistors Q1 and Q2 also have the source or the drain in common, and the source or the drain is coupled to the contact for first bit lines BLT. The first and third transistor Q1 and Q3 also have the source or the drain in common and the source or the drain is coupled to the contact for the second bit lines BLN. The second and third transistors Q2 and Q3 also have the source or the drain in common and the source or the drain is coupled to the contact for the half power source voltage input portion HVC. The second and third transistors Q2 and Q3 are arranged such that the directions of the respective gate width are arranged on one extension line. Further, the first transistor Q1 is arranged such that the direction of the gate width is different from the direction of the gate width of the second or third transistor Q2 or Q3.

In the layout of FIG. 2B, the layout of FIG. 2A is rotated by 90° and, further, the position of the contact for the equalize signal input portion EQ is changed to the top of the gate protrusion portion of the first transistor Q1. Either the layout of FIG. 2A or FIG. 2B has been generally used so far.

In connection with the above technique, Japanese Patent No. 3787500 contains disclosure regarding a write/read circuit. The write/read circuit evaluates at least one of bit lines (BL, BBL) in a DRAM memory. The write/read circuit includes at least two transistor pairs (T1/T2, T4/T5) and two transistors (T3/T6) for evaluation. The two transistor pairs (T1/T2, T4/T5) for evaluation have transistors of an identical channel type respectively. The two transistors (T3/T6) apply voltages (VDD; GND) to the transistor pairs (T1/T2, T4/T5). The transistors used in the transistor pairs (T1/T2, T4/T5) are vertical MOS transistors (T1, T2, T4, and T5). The vertical MOS transistors (T1, T2, T4, and T4) in each of the transistors pairs (T1/T2, T4/T5) and the transistors (T3, T6) used for applying the voltage (VDD; GND) have respective common source/drain regions (59, 63).

Further, Japanese Unexamined Patent Publication No. 2004-87074 discloses a semiconductor integrated circuit device. The semiconductor integrated circuit device includes a sense amplifier, a first precharge MOSFET, a selection switch MOSFET, a second precharge MOSFET, and a dynamic memory cell. The sense amplifier includes a CMOS latch circuit for amplifying and holding a pair of input/output node signals corresponding to an operation timing signal. The first precharge MOSFET includes a pair of transistors disposed to input/output nodes, put to an on-state in a precharge period, and supplying a precharge voltage to respective complementary bit line pairs of the input/output nodes. The selection switch MOSFET couples the input/output node and the complementary bit line pair corresponding to a selection signal. The second precharge MOSFET is disposed between the pair of complementary bit lines for short circuiting the same. The dynamic memory cell is disposed between one of the pair of complementary bit lines and a word line crossing the same and includes an address selection MOSFET and a memory capacitor. The semiconductor integrated circuit device has a feature of including a memory circuit in which the gate insulation film of the second precharge MOSFET is formed to a smaller thickness than that of the gate insulation film of the selection MOSFET.

Further, Japanese Unexamined Patent Publication No. 2005-340367 discloses a semiconductor integrated circuit device. The semiconductor integrated circuit device includes a sense amplifier, precharge MOSFETs including paired transistors, a selection switch MOSFET, a first equalize MOSFET, and a dynamic memory cell. The sense amplifier includes a CMOS latch circuits for amplifying and holding signals of a pair of input/output node signals corresponding to an operation timing signal. The paired precharge MOSFET are disposed to the pair of input/output nodes, put to an on state during a precharge period and supplies a precharge voltage to each of the input/output nodes. The selection switch MOSFET couples the pair of input/output nodes and the complementary bit line pair corresponding to a selection signal. The first equalize MOSFET is disposed between the pair of complementary bit lines for short circuiting the same during a precharge period. The dynamic memory cell is disposed between one of the pair of complementary bit lines and a word line crossing the same, and includes an address selection MOSFET and a memory capacitor. The gate insulation film of the selection switch MOSFET and the first equalize MOSFET is formed with a gate insulation film of a first thickness. The gate insulation film of the precharge MOSFET is formed with a gate insulation film of a second thickness which is smaller than the first thickness. A precharge signal corresponding to a power source voltage is supplied to the precharge MOSFET. The first equalize MOSFET and the selection switch MOSFET include a memory circuit which is supplied with an equalize signal corresponding to an elevated voltage defined to higher than the power source voltage and a selection signal.

SUMMARY

In general dynamic semiconductor memory devices, integration has advanced and the cell array has been divided. Then, for higher speed operation, a sense amplifier is disposed on every divided array and the occupying area of the sense amplifier is also increased, particularly in products such as built-in DRAM (eDRAM). In such situation, it is desired for the layout of the sense amplifier that the sense amplifier is formed such that the height in the extending direction of the bit line is reduced.

Figure 3A:
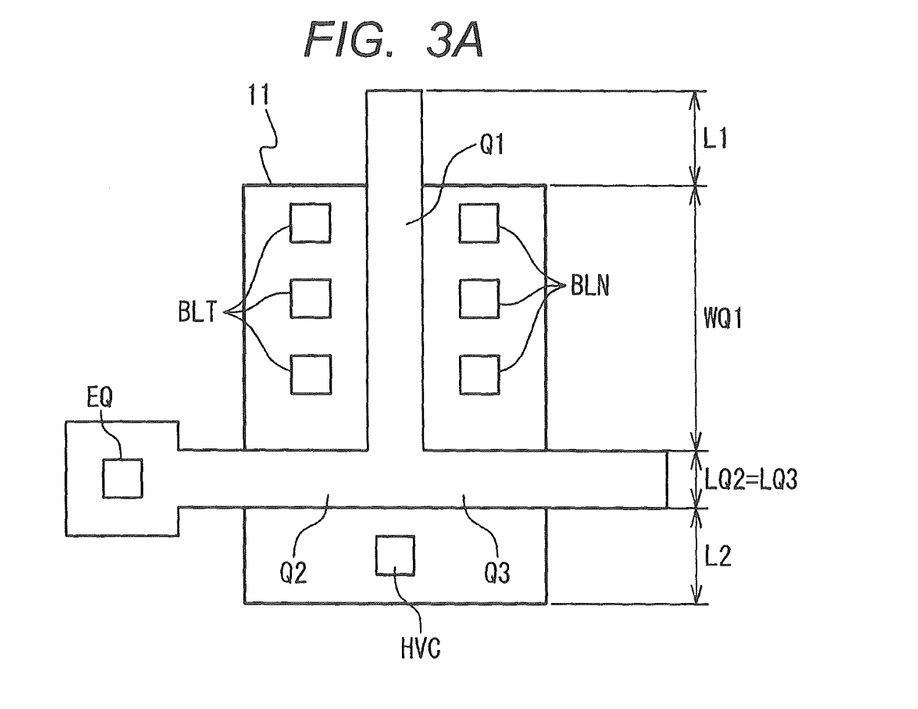
FIG. 3A is a plan view showing the size of the precharge/balance device shown in FIG. 2A when arranged in a vertical direction.

FIG. 3A is a plan view showing the size of the precharge/balance device Q shown in FIG. 2A when arranged in a vertical direction. In this case, the longitudinal size L3A in the precharge/balance device Q is determined as described below. L3A=L1+WQ1+LQ2+L2 where L1 represents a gate protrusion length, WQ1 represents the gate width of the first transistor Q1, LQ2 represents a gate length of the second transistor Q2, L2 represents the minimum source-drain width with contact. The gate length LQ2 of the second transistor Q2 is equal with the gate length LQ3 of the third transistor Q3.

Figure 3B:
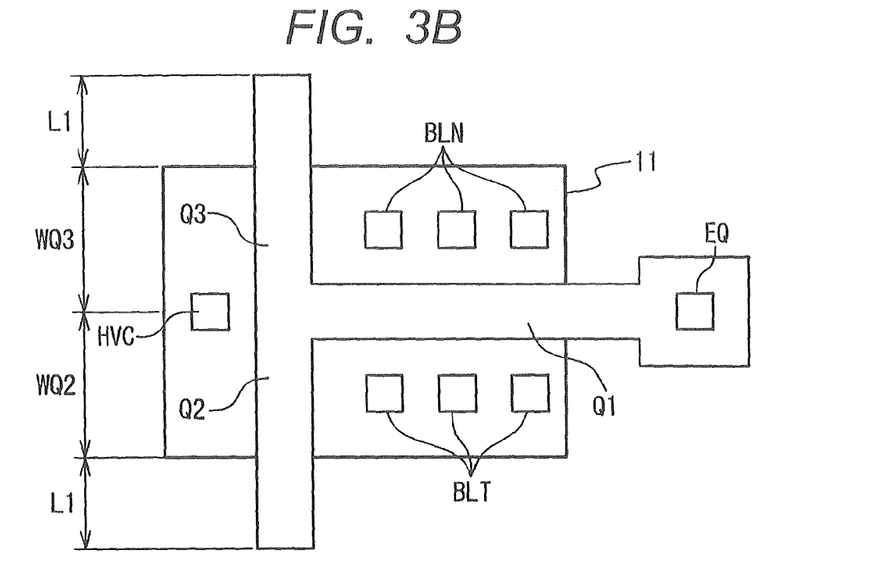
FIG. 3B is a plan view showing the size of the precharge/balance device shown in FIG. 2B when arranged in a vertical direction.

FIG. 3B is a plan view showing the size of the precharge/balance device Q shown in FIG. 2B when arranged in the lateral direction. In this case, the longitudinal size L3B in the precharge/balance device Q is determined as described below. L3B=(L1×2)+WQ2+WQ3 where L1 represents the gate protrusion length in the same manner as described above, WQ2 represents the gate width of the second transistor Q2, and WQ3 represents the gate width of the third transistor Q3.

The lateral size of the precharge/balance device Q in FIG. 3A is equal with the longitudinal size L3B of the precharge/balance device Q in FIG. 3B. In the same manner, the lateral size of the precharge/balance device Q in FIG. 3B is equal with the longitudinal size L3A of the precharge/balance device Q in FIG. 3A.

Accordingly, when both of the two sizes L3A and L3B are within a range of a width occupied by the two rows of memory cells, the shape of the precharge/balance device Q is generally selected such that the shorter side is in the longitudinal direction. However, the gate width of the first transistor Q1 is often designed actually longer than the gate width of the second or third transistor Q2 or Q3, and the gate protrusion length from the diffusion layer has to be ensured sufficiently in each of the first to third transistors Q1 to Q3. Accordingly, it is desired that the difference between the two sizes L3A and L3B is not so great and the longitudinal size for the precharge/balance device Q is further decreased.

Then, means for solving the subject are to be described below with reference to numerical numbers used in preferred embodiments of the invention. The numerical numbers are attached for clarifying the corresponding relation between claims and the preferred embodiments of the invention. However, such numerical numbers should not be used for construing the technical range of the invention described in the claims.

A semiconductor integrated circuit device according to the invention includes a diffusion layer 11, a first transistor Q2, and a second transistor Q3. The diffusion layer 11 is formed over a semiconductor substrate. The first transistor Q2 is formed over the diffusion layer 11. The second transistor Q3 is formed over the diffusion layer 11. One of the source and the drain of the first transistor Q2 is coupled to one of the source and the drain of the second transistor Q3. The gate of the first transistor Q2 is coupled to the gate of the second transistor Q3. The lateral direction of the gate of the first transistor Q2 is different from the lateral direction of the gate of the second transistor Q3.

The semiconductor integrated circuit device according to the invention equalizes two signal lines (BLN, BLT) extending in a first direction by at least three devices (Q1, Q2, and Q3). The semiconductor integrated circuit device according to the invention includes the diffusion layer 11 and a gate. The diffusion layer 11 is in common with the three devices Q1, Q2, and Q3. The gate is formed over the diffusion layer 11. The gate includes a first region (corresponding to Q1 and Q2) and a second region (corresponding to Q3). The first region (corresponding to Q1 and Q2) extends across the diffusion layer 11 in a direction crossing the first direction. The second region (corresponding to Q3) branches from the first region (corresponding to Q1 and Q2) only in the direction of one side of the diffusion layer 11 in the first direction. Two devices Q1 and Q2 among three devices are formed in the first region such that the gate width is different from each other. The remaining one device Q3 among the three devices is formed in a second region (corresponding to Q3) such that the gate width is substantially equal with that of one element Q2 of shorter gate width in the two devices Q1 and Q2.

According to the invention, since two transistors generally arranged in one identical extension line are intentionally arranged in different directions, the size of the semiconductor integrated circuit device can be reduced further, particularly, in one direction.

DETAILED DESCRIPTION

Preferred embodiments of a semiconductor integrated circuit device according to the invention are to be described below with reference to the accompanying drawings.

First Embodiment

Figure 4:
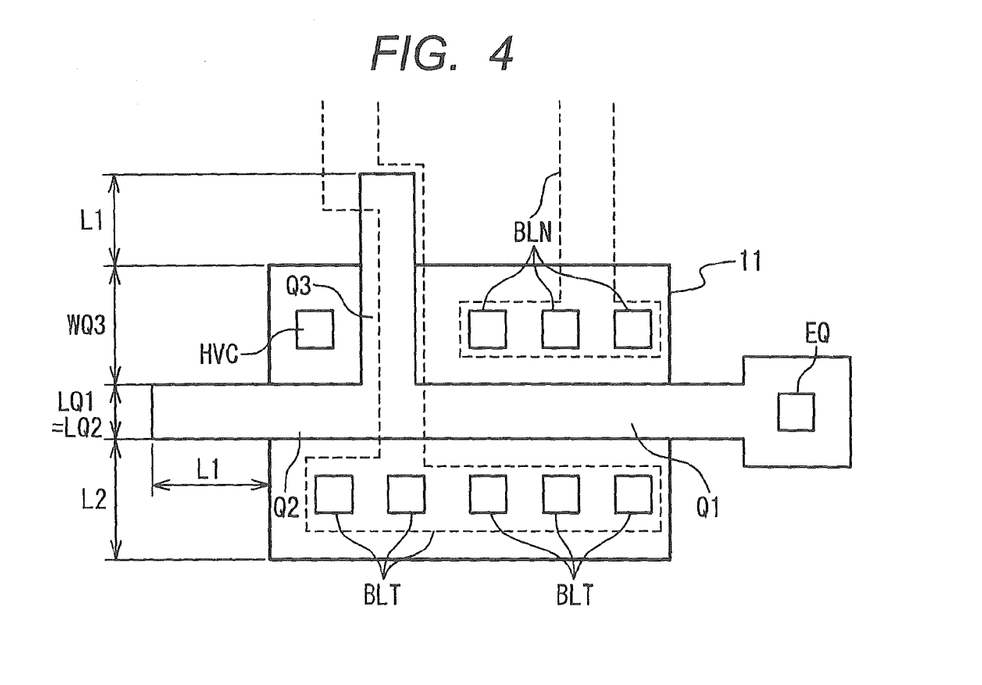
FIG. 4 is a plan view showing a layout of a semiconductor integrated circuit device according to a first embodiment of the invention.

FIG. 4 is a plan view showing a layout of a semiconductor integrated circuit device according to a first embodiment of the invention. The semiconductor integrated circuit device in FIG. 4 corresponds to a portion of the precharge/balance device Q in the sense amplifier circuit shown in the circuit diagram of FIG. 1 described above. Then, the circuit diagram of FIG. 1 is at first explained again.

Constitutional elements in the sense amplifier circuit in FIG. 1 are to be described. The sense amplifier circuit in FIG. 1 includes the first bit line BLT, the second bit line, the sense amplifier SA, the precharge/balance device Q, the equalize signal input portion EQ, and the half power source voltage input portion HVC. The precharge/balance device Q includes the first transistor Q1 as the balance device, the second transistor Q2 as the first precharge device, and the third transistor Q3 as the second precharge device. As the sense amplifier SA, a latch circuit or the like having a plurality of transistors in combination is generally used.

The coupling relation for the constitutional elements in the sense amplifier circuit in FIG. 1 is to be described. One end of the sense amplifier SA is coupled to the first bit line BLT. The other end of the sense amplifier SA is coupled to the second bit line BLN. One of the source and the drain of the first transistor Q1 is coupled to the first bit line BLT. The other of the source and the drain of the first transistor Q1 is coupled to the second bit line BLN. The gate of each of the first to third transistors Q1 to Q3 is coupled in common to the equalize signal input portion EQ. One of the source and the drain of the second transistor Q2 is coupled to the first bit line BLT. One of the source and the drain of the third transistor Q3 is coupled to the second bit line BLN. The other of the source and the drain of each of the second and third transistors Q2 and Q3 is coupled to the half power source voltage input portion HVC.

Then, the constitutional elements of the semiconductor integrated circuit device in FIG. 4 are to be described. A semiconductor integrated circuit device in FIG. 4 includes a first bit line BLT, a second bit line BLN, a precharge/balance device Q, an equalize signal input portion EQ, a half power source voltage input portion HVC, and a diffusion layer 11. The precharge/balance device Q includes a first transistor Q1 as a balance device, a second transistor Q2 as a first precharge device, and a third transistor Q3 as a second precharge device. In FIG. 4, contacts that can be coupled to the respective wirings for the first bit line BLT, the second bit line BLN, the equalize signal input portion EQ, and the half power source voltage input portion HVC are shown by solid lines. Further, for the first bit line. BLT and the second bit line BLN, an example of arrangement for the wirings in the upper layer is shown by broken lines.

The positional relation and the coupling relation of the constitutional elements of the semiconductor integrated circuit device in FIG. 4 are to be described. In the semiconductor integrated circuit device shown in FIG. 4, the first, second, and third transistors Q1, Q2, and Q3 are formed over an identical diffusion layer 11. The first, second, and third transistors Q1, Q2, and Q3 have a gate in common, and the gate is coupled to the contact for an equalize signal input portion EQ. The first and second transistors Q1 and Q2 have a source or a drain in common, and the source or the drain is coupled to the contact for the first bit line BLT. Also the first and third transistors Q1 and Q3 have the source or the drain in common, and the source or the drain is coupled to a contact for the second bit line BLN. Also the second and third transistors Q2 and Q3 have the source or the drain in common, and the source or the drain is coupled to a contact for the half power source voltage input portion HVC. The first and second transistors Q1 and Q2 are arranged such that the respective gates are arranged in on one straight line. Further, the third transistor Q3 is arranged such that the lateral direction of the gate is different from the lateral direction of gate of the first or second transistor Q1 or Q2.

Wirings for the first and second bit lines BLT and BLN can be arranged optionally by way of a plurality of contacts provided respectively in a layer upper than the layout in FIG. 4. However, it is preferred that the wirings for the first and second bit lines BLT and BLN are arranged in the direction of coupling the sense amplifier circuit and the memory cell array, that is, in the vertical direction in FIG. 4. Further, wirings coupled to the equalize signal input portion EQ are arranged in the upper layer preferably in the direction different from that of the first and second bit lines BLT and BLN and, more preferably, in the direction perpendicular thereto.

The operation of the semiconductor integrated circuit device in FIG. 4 is to be described. Since a general precharge/balance device Q in the circuit diagram in FIG. 4 is provided also by a layout in FIG. 4, an identical function is obtainable as the matter of fact. The operation of the sense amplifier in FIG. 1 is to be described schematically again.

At first, the potential difference between the first and second bit lines BLT and BLN is determined depending on the state of a memory cell coupled to one of the bit lines and selected by a word line.

Then, the half power source voltage input portion HVC supplies a half power source voltage which is one-half of the power source voltage VCC to the source-drain coupling portion of the second and third transistors Q2 and Q3. As a result, the second and third transistors Q2 and Q3 precharge the half power source voltage to the first and second bit lines BLT and BLN. As described above, the second and third transistors Q2 and Q3 operate as two precharge devices.

Then, the sense amplifier SA amplifies the difference between the voltage on the first and second bit lines BLT and BLN, and the half power source voltage to a predetermined reference voltage in accordance with a control signal from the outside.

Then, the equalize signal input portion EQ supplies an equalize signal to the gate of the first, second, and third transistors Q1, Q2, and Q3. As a result, the source and the drain are conducted in each of the first, second, and third transistors Q1, Q2, and Q3, and the voltages of the first and second bit lines BLT and BLN become equal. In this case, while a similar effect can be obtained only by the second and third transistors Q2 and Q3, when the first transistor is added, the state where the voltages of the first and second bit lines BLT and BLN become identical is attained more rapidly. Thus, the first transistor Q1 operates as a balance device.

According to this embodiment, the vertical size L4 in FIG. 4 is determined as below. L4=L1+WQ3+LQ1+L2 where L1 represents a gate protrusion length, WQ3 represents a gate width of the third transistor Q3, LQ1 represents a gate length of the first transistor Q1, and L2 represents a minimum source-drain width with contact. The gate width WQ3 of the third transistor Q3 is equal with the gate width WQ2 of the second transistor Q2, and the gate length LQ1 of the first transistor Q1 is equal with the gate length LQ2 and LQ3 of the second and third transistors Q2 and Q3. That is, according to this embodiment, the vertical size L4 in FIG. 4 is shortened by so much as the gate protrusion length L1 compared with the case of FIG. 3A or FIG. 3B described above.

The gate protrusion length L1 is indispensable so that the gates of the first to third transistors Q1 to Q3 are formed appropriately in the diffusion layer 1, and this is a length not negligible compared with the size of the diffusion layer 11. Further, in a dynamic semiconductor memory device, etc., the sense amplifier circuit containing the precharge/balance device Q in FIG. 4 is periodically arranged in the vertical direction of FIG. 4. Accordingly, reduction of the size in the vertical direction in FIG. 4 according to this embodiment can provide an outstanding effect as the entire semiconductor integrated circuit device.

In general dynamic semiconductor memory devices, etc., an identical equalize signal is supplied simultaneously to all of a plurality of sense amplifier circuits arranged along one side of a memory cell array. In such a case, when the layout in FIG. 4 is arranged as one unit circuit in plurality in the lateral direction in FIG. 4, such unit circuits may be coupled in the lateral direction. That is, in a case of unit circuits adjacent in the right-to-left direction, the contact for the equalize signal input portion EQ arranged to the right end of the unit circuit on the left may be coupled to the gate protrusion portion of the second transistor Q2 arranged to the left end of the unit circuit on the right. Further, input wirings to the diffusion layer 11 for the respective BLT and BLN in FIG. 4 shown by dotted lines are only the schematic expression and they may also be formed, for example, by wide input wirings having a width for several contacts.

Second Embodiment

Figure 5:
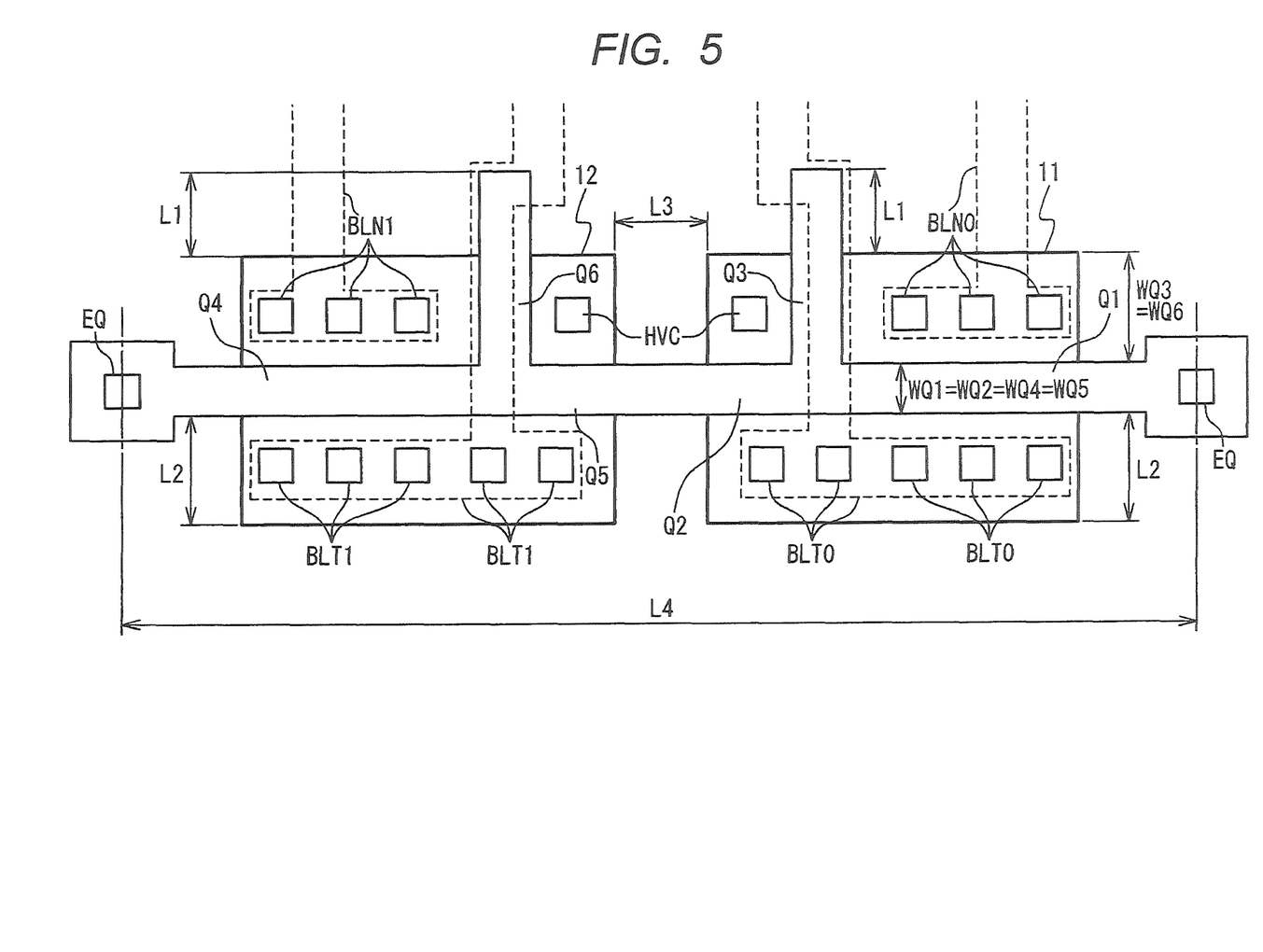
FIG. 5 is a plan view showing a layout of a semiconductor integrated circuit device according to a second embodiment of the invention.

FIG. 5 is a plan view showing a layout of a semiconductor integrated circuit device according to the first embodiment of the invention. In the semiconductor integrated circuit device shown in FIG. 5, a precharge/balance device Q according to the first embodiment of the invention that has been described with reference to FIG. 4 is arranged and combined by the number of two in the right-to-left direction. In this embodiment, the precharge/balance device on the right has a layout identical with that in FIG. 4, while the precharge/balance device on the left has a layout mirror inverted left to right relative to the layout in FIG. 4. In the following description, the precharge/balance device on the left is referred to as a first precharge/balance device and the precharge/balance device on the right is referred to as a second precharge/balance device.

Constitutional elements of the first and second precharge/balance devices are to be described. The first precharge/balance device includes a first diffusion layer 11, first, second, and third transistors Q1, Q2, and Q3, a contact for a first bit line BLT0, a contact for a second bit line BLT0, a contact for an equalize signal input portion EQ, and a contact for a half power source voltage input portion HVC. The second precharge/balance device includes a second diffusion layer 12, fourth, fifth, and sixth transistors Q4, Q5, and Q6, a contact for a third bit line BLT1, a contact for a fourth bit line BLN1, a contact for an equalize signal input portion EQ, and a contact for a half power source voltage input portion HVC.

Description is to be made for the corresponding relation between each of the constituent elements in each of the first and second precharge/balance devices according to this embodiment shown in FIG. 5, and each of the constituent elements of the precharge/balance device according to the first embodiment of the invention shown in FIG. 4. The first and second diffusion layers 11 and 12 in FIG. 5 correspond to the diffusion layer 11 in FIG. 4. The first and fourth transistors Q1 and Q4 in FIG. 5 correspond to the first transistor Q1 in FIG. 4. The second and fifth transistors Q2 and Q5 in FIG. 5 correspond to the second transistor Q2 in FIG. 4. The third and sixth transistors Q3 or Q6 in FIG. 5 correspond to the third transistor Q3 in FIG. 4. The contacts for the first and third bit lines BLT0 and BLT1 in FIG. 5 correspond to the contacts for the first bit line BLT in FIG. 4. The contacts for the second and fourth bit lines BLN0 and BLN1 in FIG. 5 correspond to the contact for the second bit line BLN in FIG. 4. The contact for the equalize signal input portion EQ in FIG. 5 corresponds to the contact for the equalize signal input portion EQ in FIG. 4. The contact for the half power source voltage input portion HVC in FIG. 5 corresponds to the contact for the half power source voltage input portion HVC in FIG. 4.

Further, when more precharge/balance devices are arranged in the lateral direction in FIG. 5, the total number of the contacts for the equalize signal input portions EQ can be sometimes decreased to one severalth of the number of the precharge/balance devices. As has been described also for the first embodiment of the invention, this is a case where a plurality of sense amplifiers arranged in one row along one side of the memory cell array have an identical equalize signal in common. In this case, the pitch in the direction of arranging a plurality of precharge/balance devices can be further decreased. Alternatively, in a case where the lateral pitch in FIG. 5 is fixed for the sake of the memory cell array, the gate width of the first and fourth transistors Q1 and Q4 that operate as the balance device can be further extended to also improve the performance of the balance device.

Since the relation of arrangement and the coupling relation of other constituent elements in each of the first and second precharge/balance devices in FIG. 5 as well as the operation thereof are identical with those of the first embodiment of the invention, further detailed explanation is to be omitted.

Third Embodiment

Figure 6:
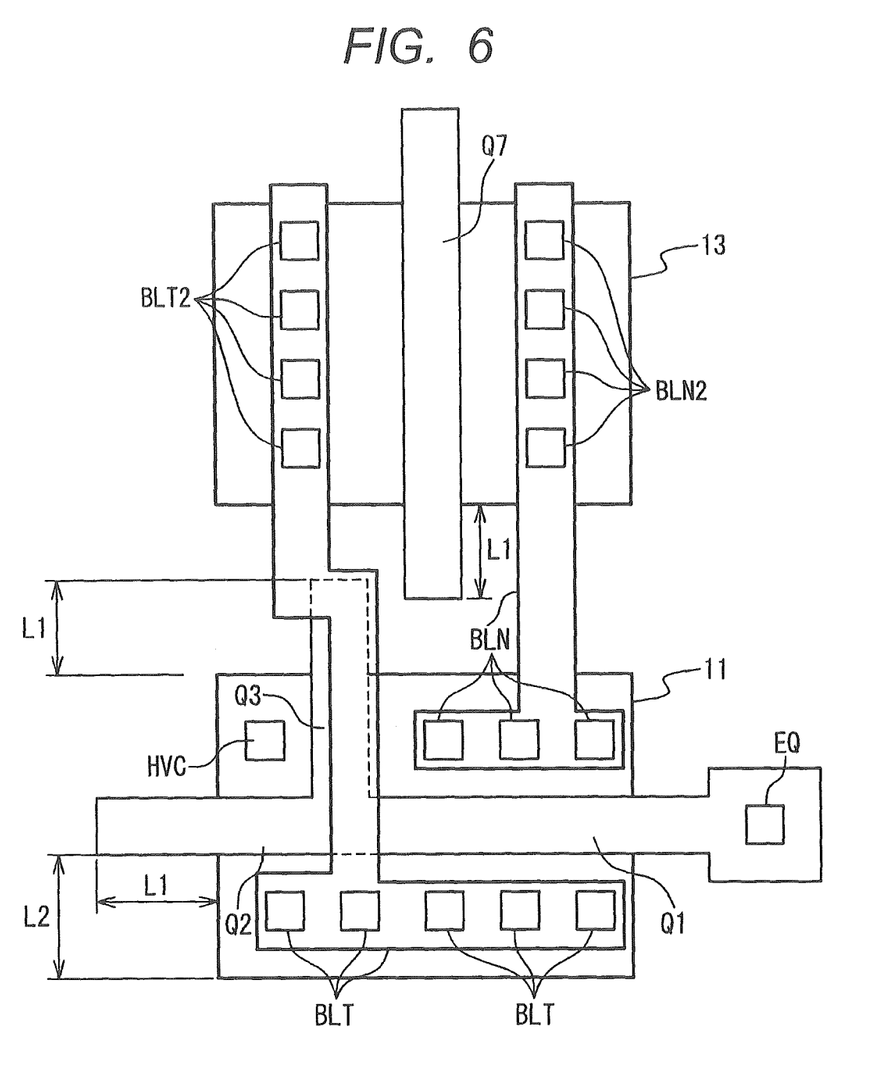
FIG. 6 is a plan view showing a layout of a semiconductor integrated circuit device according to a third embodiment of the invention.

FIG. 6 is a plan view showing a layout of a semiconductor integrated circuit device according to the first embodiment of the invention. For the first and second embodiments of the invention, while description has been made to the case of laterally arranging a plurality of diffusion layers, description is to be made for this embodiment to a case of vertically arranging a plurality of diffusion layers.

The semiconductor integrated circuit device in FIG. 6 includes a second diffusion layer 13 in addition to the precharge/balance device according to the first embodiment of the invention described with reference to FIG. 4. In a second diffusion layer 13, a seventh transistor Q7, a contact BLT2 for first bit line BLT, and contacts BLN2 for a second bit line BLN are formed. A contact BLT2 for the first bit lines BLT is coupled to the first bit lines BLT. A contact BLN2 for a second bit line BLN is coupled to the second bit lines BLN.

The contacts for the first bit lines BLT formed in the first and second diffusion layers 11 and 13 are coupled by way of wirings for the first bit line BLT in the upper layer. In the same manner, the contacts for the second bit lines BLN formed in the first and second diffusion layers 11 and 13 are coupled by way of wirings for the second bit line BLN in the upper layer. That is, the seventh transistor Q7 can operate also as a sense amplifier SA or a portion thereof shown in the circuit diagram in FIG. 1. The semiconductor integrated circuit device in FIG. 6 is hereinafter explained such that it corresponds to the entire sense amplifier shown in the circuit diagram in FIG. 1.

The first and second diffusion layers 11 and 13 are arranged vertically in FIG. 6, and spaced apart by a predetermined distance. By arranging the gate protrusion portions of the third and seventh transistors Q3 and Q7 in a staggered pattern, the distance between the first and second diffusion layers 11 and 13 can be designed shorter than twice of the gate protrusion length L1.

As described above, according to the layout of the semiconductor integrated circuit device of this embodiment, the vertical size in FIG. 6 can be shortened further.

Since the relation of arrangement and the coupling relation of other constituent elements in the semiconductor integrated circuit device according in this embodiment, as well as the operation thereof are identical with those of the first embodiment of the invention, further detailed explanation is to be omitted.

The respective features in each of the preferred embodiments described above can be optionally combined within a range not technically conflicting with each other. For example, a plurality of diffusion layers can be naturally laid out by arranging them in the lateral direction as described for the first and second embodiments, and also in the vertical direction as described in the third embodiment. Further, in this case, the unit circuits according to the first to third embodiments may be partially or entirely invented vertically or laterally, or may be rotated clockwise or counterclockwise.

While the description has been made mainly to the example of the sense amplifier circuit of the dynamic semiconductor memory device, the invention is applicable to any other semiconductor integrated circuit device and the embodiments described above do not restrict the invention. For example, the gate width of the first transistor Q1 may not always be longer than the gate width of the second and third transistors Q2 and Q3. Further, the gate width may not always be identical between the second and third transistors Q2 and Q3.

What is claimed is:

1. A semiconductor integrated circuit device, comprising:
a pair of complementary signal lines;
a first transistor including a gate, a source, and a drain, one of the source and the drain of the first transistor being coupled to one of the pair of the complementary signal lines; and
a second transistor including a gate, a source, and a drain, the gate of the second transistor being coupled to the gate of the first transistor, one of a source and a drain of the second transistor being coupled to an other of the source and the drain of the first transistor, and an other of the source and the drain of the second transistor being coupled to an other of the pair of the complementary signal lines,
wherein a direction of a gate width of the first transistor is different from a direction of a gate width of the second transistor.

2. The semiconductor integrated circuit device according to claim 1, wherein the gate width of the first transistor is substantially equal to the gate width of the second transistor.

3. The semiconductor integrated circuit device according to claim 1, wherein a diffusion layer of the other of the source and the drain of the first transistor and a diffusion layer of the one of the source and the drain of the second transistor are shared.

4. The semiconductor integrated circuit device according to claim 1, wherein the other of the source and the drain of the first transistor is supplied with a predetermined voltage.

5. The semiconductor integrated circuit device according to claim 1, further comprising:
a third transistor including a gate coupled to the gate of the first transistor, and being coupled between the pair of complementary signal lines,
wherein a direction of a gate width of the third transistor and the direction of the gate width of the first transistor are provided on one identical extension line.

6. The semiconductor integrated circuit device according to claim 5, wherein a diffusion layer of the one of the source and the drain of the first transistor and a diffusion layer of one of a source and a drain of the third transistor are shared, a diffusion layer of the other of the source and the drain of the first transistor and a diffusion layer of the one of the source and the drain of the second transistor are shared, and a diffusion layer of the other of the source and the drain of the second transistor and a diffusion layer of an other of the source and the drain of the third transistor are shared.

7. The semiconductor integrated circuit device according to claim 5, wherein the gate width of the third transistor is longer than the gate width of the first and the gate width of the second transistor.

8. The semiconductor integrated circuit device according to claim 1, further comprising:
a first diffusion layer formed adjacent to a second diffusion layer on which the second transistor is formed; and
a fourth transistor formed on the first diffusion layer,
wherein the first and the second diffusion layers are arranged in a direction of a gate protrusion portion of the second transistor,
wherein the fourth transistor includes a gate protrusion portion directed from the first diffusion layer to the second diffusion layer, and
wherein the gate protrusion portion of the second transistor and the gate protrusion portion of the fourth transistor are arranged in a staggered pattern with respect to the direction of the gate width of the first transistor.

9. The semiconductor integrated circuit device according to claim 1, wherein the pair of complementary signal lines comprises a first pair of complementary signal lines,
wherein the semiconductor integrated circuit device further comprises a second pair of complementary signal lines, and a fourth transistor and a fifth transistor coupled in series between the second pair of complementary signal lines and receiving the control signal at gates thereof,
wherein a direction of a gate width of the fourth transistor is different from a direction of a gate width of the fifth transistor, and
wherein a direction of the gate width of the fourth transistor and the direction of the gate width of the first transistor are provided on one identical extension line.

* * * * *